United States Patent
Chen et al.

(10) Patent No.: US 8,043,919 B2
(45) Date of Patent: Oct. 25, 2011

(54) METHOD OF FABRICATING SEMICONDUCTOR DEVICE

(75) Inventors: Tai-Ju Chen, Tainan (TW); Tung-Hsing Lee, Taipei Hsien (TW); Da-Kung Lo, Taoyuan County (TW)

(73) Assignee: United Microelectronics Corp., Hsinchu (TW)

( * ) Notice: Subject to any disclaimer, the term of this patent is extended or adjusted under 35 U.S.C. 154(b) by 236 days.

(21) Appl. No.: 11/938,506

(22) Filed: Nov. 12, 2007

(65) Prior Publication Data

US 2009/0124056 A1   May 14, 2009

(51) Int. Cl.
*H01L 21/336* (2006.01)
*H01L 21/02* (2006.01)

(52) U.S. Cl. ........ 438/300; 438/285; 438/429; 257/190; 257/616; 257/E29.193

(58) Field of Classification Search ........... 257/E29.193, 257/190; 438/429, 300, 285
See application file for complete search history.

(56) References Cited

U.S. PATENT DOCUMENTS

| | | | |
|---|---|---|---|
| 6,048,756 A | 4/2000 | Lee et al. | |
| 6,228,730 B1 | 5/2001 | Chen et al. | |
| 6,368,926 B1 | 4/2002 | Wu | |
| 7,745,847 B2 | 6/2010 | Tseng et al. | |
| 2002/0079507 A1 | 6/2002 | Shim et al. | |
| 2004/0262694 A1 | 12/2004 | Chidambaram | |
| 2005/0266631 A1* | 12/2005 | Kim et al. | 438/216 |
| 2006/0228842 A1 | 10/2006 | Zhang et al. | |
| 2007/0012913 A1 | 1/2007 | Ohta et al. | |
| 2007/0235802 A1* | 10/2007 | Chong et al. | 257/346 |
| 2007/0235817 A1* | 10/2007 | Wang et al. | 257/392 |
| 2008/0006818 A1* | 1/2008 | Luo et al. | 257/19 |
| 2008/0006854 A1* | 1/2008 | Luo et al. | 257/288 |
| 2008/0277699 A1* | 11/2008 | Chakravarthi et al. | 257/289 |

FOREIGN PATENT DOCUMENTS
TW   I287254   2/2005

* cited by examiner

*Primary Examiner* — Ha Tran T Nguyen
*Assistant Examiner* — Aaron Dehne
(74) *Attorney, Agent, or Firm* — WPAT, PC; Justin King

(57) ABSTRACT

A method of fabricating a semiconductor device is provided. A gate structure is formed on a substrate and then a first spacer is formed at a sidewall of the gate structure. Next, recesses are respectively formed in the substrate at two sides of the first spacer. Thereafter, a buffer layer and a doped semiconductor compound layer are formed in each recess. An extra implantation region is respectively formed on the surfaces of each buffer layer and each doped semiconductor compound layer. Afterward, source/drain contact regions are formed in the substrate at two sides of the gate structure.

18 Claims, 6 Drawing Sheets

METHOD OF FABRICATING SEMICONDUCTOR DEVICE

BACKGROUND OF THE INVENTION

1. Field of the Invention

The present invention relates to a method of fabricating an integrated circuit (IC), and more particularly to a method of fabricating a semiconductor device.

2. Description of Related Art

MOS transistors are basic structures widely used in various semiconductor devices such as memory devices, image sensors, or displays. A typical MOS transistor includes a silicon oxide dielectric layer, a gate conductive layer, and a heavily-doped source/drain contact regions. Along with the decrease of a line width, the size of the semiconductor device is reduced. A channel length of the typical MOS transistor is reduced as a gate width is reduced. Since a threshold voltage becomes smaller and a subthreshold current is increased, a short channel effect is induced. On the other hand, after the gate length is reduced, an electric field between a source and a drain is enhanced, which causes a hot carrier effect. Thus, a lot of carriers may be generated in the channel at a position near the drain region, thus resulting in an electrical breakdown effect. In order to prevent the breakdown phenomenon, it is necessary to maintain a proper channel length. As such, the formed MOS transistor is not applicable.

In order to solve the above problem, a lightly doped drain (LDD) structure is adopted. In the LDD structure, concentration of the source/drain region near the channel is reduced, i.e., an LDD region is formed, so as to alleviate the hot carrier effect resulting from the enhancement of the electric field between the source and the drain. However, since the dopant concentration of the LDD region is low, the resistance is relatively high, which results in a reduced device current and a slow operating speed of the device, and the power consumption is increased.

It is a method for improving the operating speed of the transistor that a mechanical-stress in the channel is controlled to change the mobility of electrons and holes in the channel. The conventional art has proposed a material, for example, SiGe epitaxy used as a major component of the source/drain contact region of the p-channel MOS (PMOS) transistor. Compared with material characteristics of silicon, the SiGe, when used as the major component of the source/drain contact region, exerts a compressive stress on the channel due to a larger atomic volume of Ge. Therefore, the SiGe when used as a major material of the source/drain contact region can enhance the mobility of holes, thus further improving the performance of the device.

For a PMOS transistor, the Boron implanted in the doped region is liable to diffuse outwards to channel, thus resulting in a short channel effect. In order to solve the problem of Boron diffusion, a method of adding an undoped SiGe buffer layer between the doped region and the substrate has been proposed. However, in non-doped SiGe, Boron may also easily diffuse to the channel region, so usually the undoped SiGe layer must be thick enough to achieve a sufficient barrier effect. However, the resistance of the undoped SiGe is high, so the thicker the undoped SiGe buffer layer is, the greater the effect on the resistance of the doped region is, and the weaker the performance of the device will be. On the other hand, a current leakage problem resulting from the substrate and the buffer layer interface deficiencies is in urgent need of being solved.

SUMMARY OF THE INVENTION

Accordingly, the present invention is directed to provide a method of fabricating a semiconductor device, which can effectively reduce the problem of high resistance resulting from the forming of a buffer layer.

The present invention is directed to provide a method of fabricating a semiconductor device, which can reduce the current leakage resulting from the substrate and the buffer layer interface deficiencies.

The present invention provides a method of fabricating a semiconductor device, which includes the following steps. A gate structure is formed on a substrate. Then, a first spacer is formed at a sidewall of the gate structure. Then, recesses are respectively formed in the substrate at two sides of the first spacer. Next, a buffer layer and a doped semiconductor compound layer are formed in each recess. Afterward, an extra implantation region is respectively formed on the surfaces of each buffer layer and each doped semiconductor compound layer. Thereafter, source/drain contact regions are formed in the substrate at two sides of the gate structure.

In the method of fabricating a semiconductor device according to an embodiment of the present invention, the source/drain contact regions are formed after the extra implantation regions are formed. A forming method of the source/drain contact regions includes forming a second spacer at the sidewall of the gate structure, and then performing an ion implantation process, so as to form the source/drain contact regions in the substrate not covered by the second spacer.

According to an embodiment of the present invention, the method of fabricating a semiconductor device further includes removing the first spacer before forming the second spacer.

According to an embodiment of the present invention, the method of fabricating a semiconductor device further includes forming a source/drain extension region respectively in the substrate at two sides of the gate structure before forming the first spacer.

According to an embodiment of the present invention, the method of fabricating a semiconductor device further includes forming an offset spacer at the sidewall of the gate structure before forming the source/drain extension regions.

In the method of fabricating a semiconductor device according to an embodiment of the present invention, the source/drain contact regions are formed after the gate structure is formed and before the first spacer is formed. The method of fabricating a semiconductor device includes the following steps. A second spacer is formed at the sidewall of the gate structure. Then, an ion implantation process is performed, so as to form the source/drain contact regions in the substrate. Next, the second spacer is removed, and then the first spacer is formed. Thereafter, the substrate of a part of the source/drain contact regions is removed, so as to form the recesses above the remaining source/drain contact regions.

According to an embodiment of the present invention, the method of fabricating a semiconductor device further includes forming a source/drain extension region respectively in the substrate at two sides of the gate structure before forming the second spacer.

According to an embodiment of the present invention, the method of fabricating a semiconductor device further includes forming an offset spacer at the sidewall of the gate structure before forming the source/drain extension regions.

In the method of fabricating a semiconductor device according to an embodiment of the present invention, a forming method of the extra implantation regions includes performing an ion implantation process.

In the method of fabricating a semiconductor device according to an embodiment of the present invention, the energy of the ion implantation process is not greater than that of the source/drain contact regions and not less than that of the source/drain extension regions.

In the method of fabricating a semiconductor device according to an embodiment of the present invention, a concentration of dopant implanted in each extra implantation region is not greater than that of the source/drain contact regions.

In the method of fabricating a semiconductor device according to an embodiment of the present invention, a concentration of dopant implanted in each extra implantation region is not less than that of the source/drain extension regions formed in the substrate.

In the method of fabricating a semiconductor device according to an embodiment of the present invention, the extra implantation regions and the source/drain contact regions have dopants of the same conductivity type.

In the method of fabricating a semiconductor device according to an embodiment of the present invention, the semiconductor device includes a PMOS device.

In the method of fabricating a semiconductor device according to an embodiment of the present invention, the doped semiconductor compound includes P-type doped SiGe.

In the method of fabricating a semiconductor device according to an embodiment of the present invention, the buffer layer includes an undoped SiGe or a P-type doped SiGe with a dopant concentration lower than that of the doped semiconductor compound.

In the method of fabricating a semiconductor device according to an embodiment of the present invention, the semiconductor device includes an NMOS device.

In the method of fabricating a semiconductor device according to an embodiment of the present invention, the doped semiconductor compound includes N-type doped SiC.

In the method of fabricating a semiconductor device according to an embodiment of the present invention, the buffer layer includes an undoped SiC or an N-type doped SiC with a dopant concentration lower than that of the doped semiconductor compound.

According to an embodiment of the present invention, the method of fabricating a semiconductor device further includes forming a contact etch stop layer (CESL) above the substrate.

In the method of fabricating a semiconductor device according to an embodiment of the present invention, a simple process is for forming the extra implantation region, so as to solve the problem that the resistance value is over-higher resulting from the forming of the buffer layer.

In the method of fabricating a semiconductor device according to an embodiment of the present invention, the extra implantation regions may extend from the surface of the buffer layer into the source/drain extension region, thereby alleviating the current leakage problem resulting from the substrate and the buffer layer interface deficiencies.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The method according to an embodiment of the present invention includes forming an extra implantation region on a surface of the buffer layer to reduce the resistance.

FIGS. 1A to 1F are schematic cross-sectional views showing processes of a method of fabricating the semiconductor device according to an embodiment of the present invention.

Figure 1A:
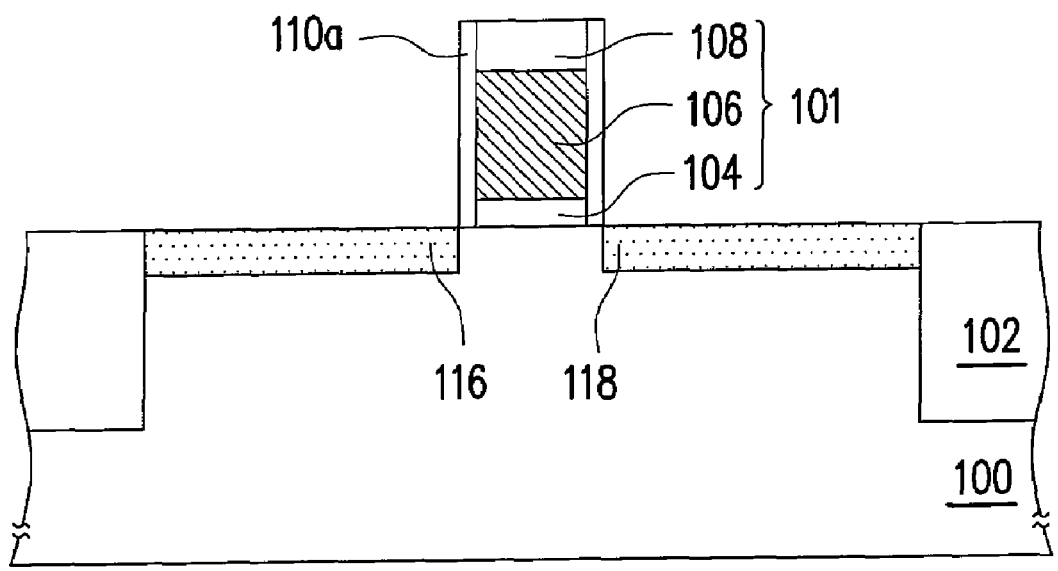
FIGS. 1A to 1F are schematic cross-sectional views showing processes of a method of fabricating a semiconductor device according to an embodiment of the present invention.

Referring to FIG. 1A, a substrate 100 is provided. The material of the substrate 100 is, for example, semiconductor, e.g., silicon, or semiconductor compound, or a silicon-on-insulator (SOI) substrate. In an embodiment, the substrate 100 is an N-type doped silicon or a P-type doped silicon with an N-well region. In another embodiment, the substrate 100 is a P-type doped silicon or an N-type doped silicon with a P-well region. Then, an isolation structure 102 is formed in the substrate 100. The forming method of the isolation structure 102 is, for example, a shallow trench isolation structure method or a local oxidation method.

Then, a gate structure 101 is formed on the substrate 100. When the device is a MOS device, the gate structure 101 includes a patterned gate dielectric layer 104 and a patterned gate conductive layer 106. In addition, the gate structure 101 may further include a patterned cap layer 108. The material of the gate dielectric layer 104 is, for example, silicon oxide, silicon nitride, silicon oxynitride, or a high-k material, and the forming method is, for example, a thermal oxidation or a chemical vapor deposition (CVD). When the material of the gate conductive layer 106 is doped silicon or doped polysilicon, the dopant in the silicon or the polysilicon may be N-type dopant, and may also be P-type dopant. The material of the cap layer 108 is, for example, silicon oxide or silicon nitride, and the forming method is, for example, CVD. Then, an offset spacer 110a is formed at the sidewall of the gate structure 101. The material of the offset spacer 110a is, for example, silicon oxide or silicon nitride, and the forming method is, for example, thermal oxidation or CVD.

Then, source/drain extension regions 116 and 118 and a pocket-doped region (not shown) are formed in the substrate 100 at two sides of the gate structure 101. When the formed semiconductor device is a PMOS device, the dopant of the source drain extension regions 116 and 118 is P-type dopant, e.g. B, and the dopant of the pocket-doped region is N-type dopant, e.g. P or As. When the formed semiconductor device is an NMOS device, the dopant of the source drain extension regions 116 and 118 is N-type dopant, e.g. P or As, and the dopant of the pocket-doped region is P-type dopant, e.g. B. The forming method of the source/drain extension regions 116 and 118 includes performing an ion implantation process. The pocket-doped region may be formed through an ion implantation process.

Figure 1B:
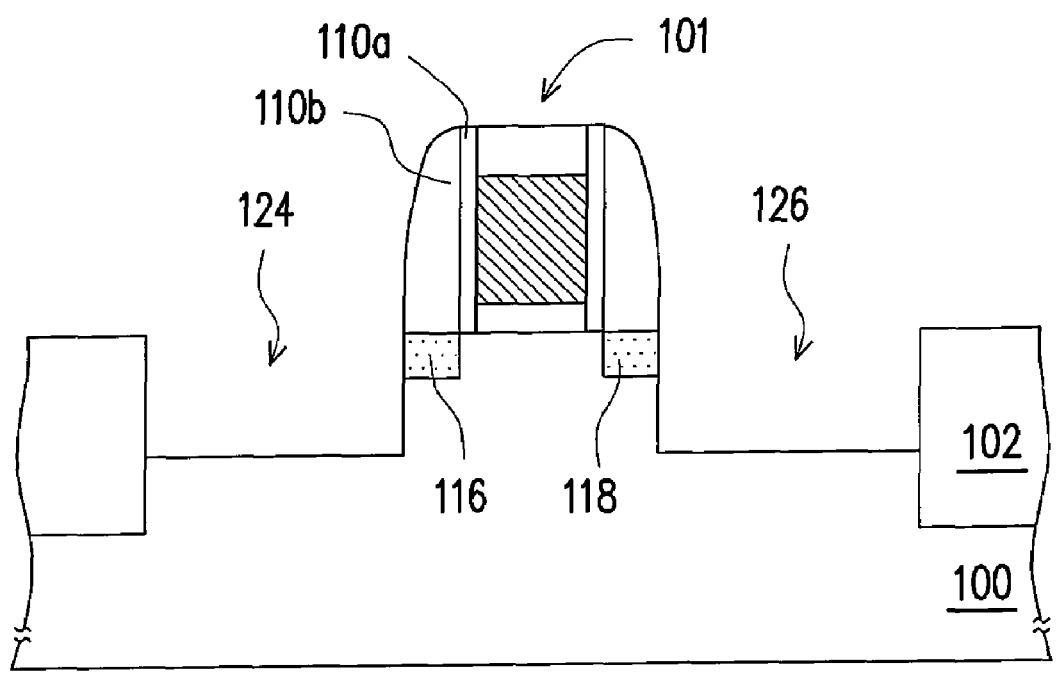

Then, referring to FIG. 1B, a disposable spacer 110b is formed on the offset spacer 110a of the sidewall of the gate structure 101. The disposable spacer 110b may be formed by using the CVD for forming a spacer material layer and an anisotropic etching process. The material of the spacer material layer includes a dielectric material, e.g. silicon oxide or silicon nitride.

Then, the cap layer 108 and the disposable spacer 110b are used as a mask to perform an etching process to etch the substrate 100 at two sides of the gate structure 101, so as to form recesses 124 and 126. The etching process includes an anisotropic etching process or an isotropic etching process. The anisotropic etching process includes a dry etching process. In an embodiment, the dry etching process is, for example, a plasma etching process, and the introduced reaction gases are fluoro-hydrocarbons, e.g. $CF_4$ and $CHF_3$. The isotropic etching process is, for example, the dry etching process or a wet etching process. In an embodiment, the dry etching process is a plasma etching process, and the introduced reaction gases are $NF_3$, $O_2$, and $Cl_2$. The method of the wet etching process, for example, uses KOH solution as an etchant.

Figure 1C:
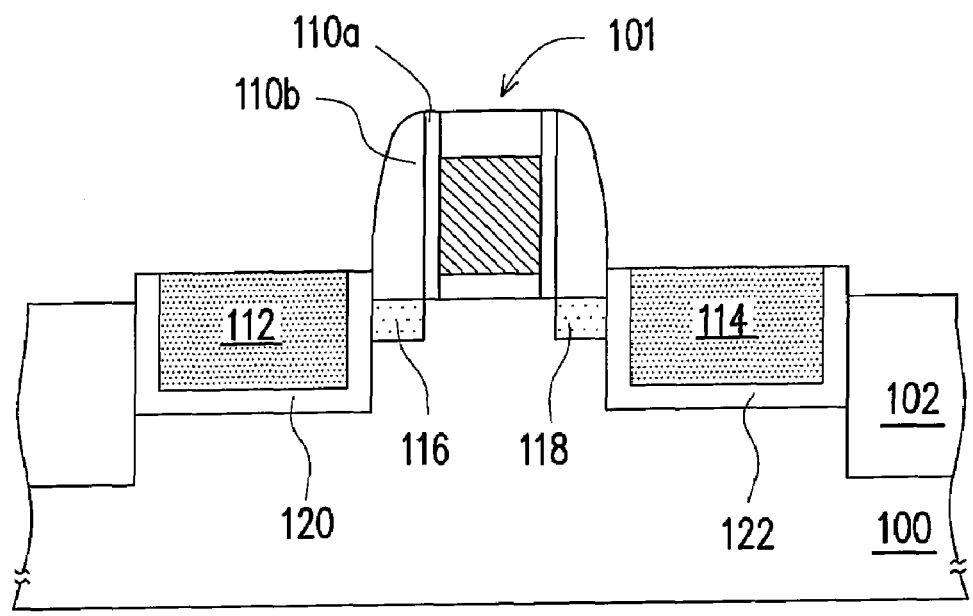

After that, referring to FIG. 1C, firstly buffer layers 120 and 122 are formed in the recesses 124 and 126, and then doped semiconductor compound layers 112 and 114 are formed. The buffer layers 120 and 122 and the doped semiconductor compound layers 112 and 114 may be located only in the recesses 124 and 126, or extend upwards from the bottom of the recesses and protrude out of the surface of the substrate 100. The material of the buffer layers 120 and 122 and the doped semiconductor compound layers 112 and 114 is different from the material of the substrate 100, and includes an undoped semiconductor compound material or a lightly doped semiconductor compound material having the same conductivity type of the source/drain extension regions 116 and 118, the semiconductor compound layers 112 and 114, or the subsequently formed source/drain contact regions.

When the formed semiconductor device is a PMOS device, the semiconductor compound material for forming the buffer layers 120 and 122 includes non-doped SiGe or SiGe with low P-type dopant, e.g. B. The forming method of the buffer layers 120 and 122 may adopt the CVD to perform a selective area epitaxy growth process of silicon to form an undoped SiGe epitaxy layer. The reaction gases adopted for forming the undoped SiGe epitaxy layer include a Si and a Ge sources. For example, silane or halogenosilane are used as the Si source, and germane is used as the Ge source. Silane is, for example, silicon tetrahydride, and halogenosilane is, for example, dichlorosilane. In an embodiment, the adopted reaction gases include dichlorosilane, germane, and hydrogen chloride. In another embodiment, the material of the buffer layers 120 and 122 is SiGe with low B. B may be doped in-situ with borane introduced as a B-doping source during the SiGe epitaxy forming process, or may result from the diffusion of B in the source drain extension regions 116 and 118 or the subsequently formed doped regions 112 and 114.

When the formed semiconductor device is a PMOS device, the material for forming the doped semiconductor compound layers 112 and 114 includes SiGe with P-type dopant, such as B. The forming method includes adopting the CVD to perform the selective area epitaxy growth process of silicon and the in-situ doping to form a doped SiGe epitaxy layer after the buffer layers 120 and 122 are formed. The reaction gases adopted for forming the doped SiGe epitaxy layer include a Si source, a Ge source, and a B-doping source. For example, silane or halogenosilane are used as the Si source, germane is used as the Ge source, and borane is used as the B-doping source. Silane is, for example, silicon tetrahydride ($SiH_4$), and halogenosilane is, for example, dichlorosilane ($SiCl_2H_2$). In an embodiment, the adopted reaction gases include dichlorosilane, germane, borane, and hydrogen chloride.

When the formed semiconductor device is an NMOS device, the semiconductor compound material for forming the buffer layers 120 and 122 includes non-doped SiC or SiC with low N-type dopant, for example, P or As. In an embodiment, the forming method of the buffer layers 120 and 122 may also adopt the CVD to perform a selective area epitaxy growth process of silicon to form an undoped SiC epitaxy layer. The reaction gases adopted for forming the undoped SiC epitaxy layer include Si source and C source. The Si source includes silane or halogenosilane, and the C source includes ethylene, propane or monomethylsilane. In an embodiment, the adopted reaction gases include monomethylsilane, $Si_3H_8$, and hydrogen. In another embodiment, the material of the buffer layers 120 and 122 is SiC with low N-type dopant. The N-type dopant may be doped in-situ with $AsH_3$ or $PH_3$ introduced as the N-type doping source during the SiC epitaxy forming process.

When the formed semiconductor device is an NMOS device, the material for forming the doped semiconductor compound layers 112 and 114 includes SiC with N-type dopant, such as P or As. The forming method may also adopt the CVD to perform the selective area epitaxy growth process of silicon and the in-situ doping to form a doped SiC epitaxy layer after the buffer layers 120 and 122 are formed. The reaction gases adopted for forming the doped SiC epitaxy layer include Si source, C source, and P or As doping source. The Si source includes silane or halogenosilane, the C source includes ethylene, propane or monomethylsilane, and the P or As doping source includes $AsH_3$ or $PH_3$. In an embodiment, the adopted reaction gases include monomethylsilane, $Si_3H_8$, hydrogen, and $PH_3$.

Figure 1D:
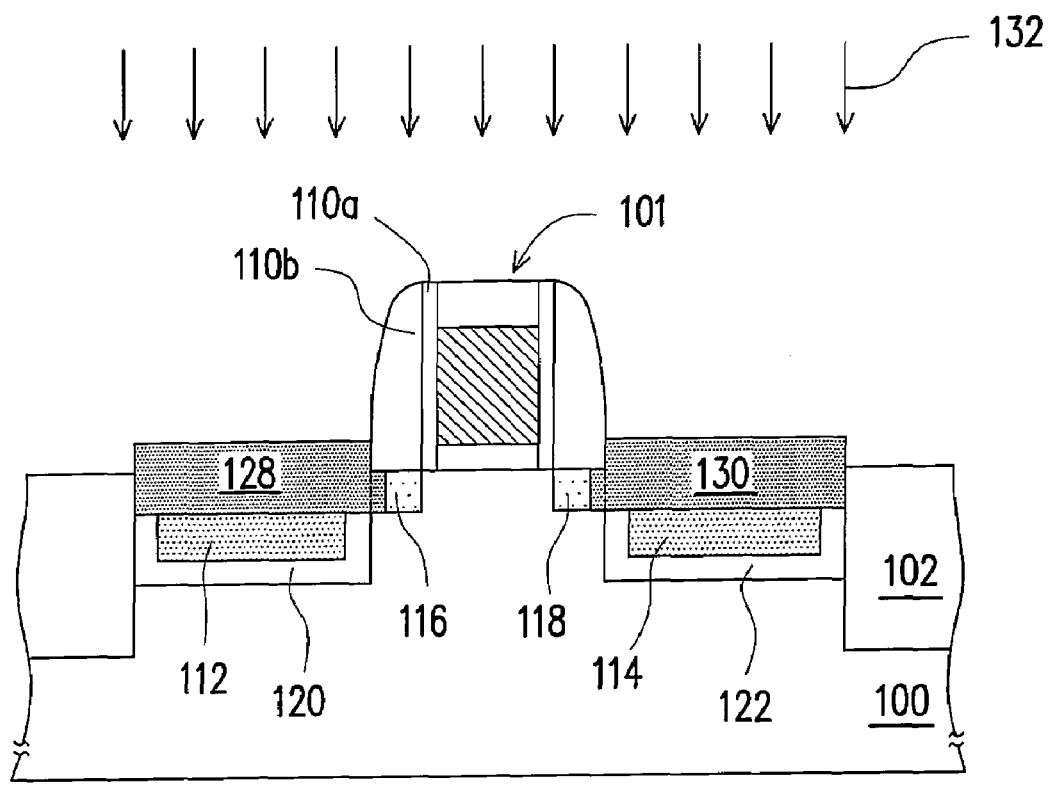

Then, referring to FIG. 1D, the dopant is implanted on the surfaces of the buffer layers 120 and 122 and the doped semiconductor compound layers 112 and 114, so as to form extra implantation regions 128 and 130 with a shallow junction respectively. The dopant implanted into the extra implantation regions 128 and 130 has the same conductivity type of the source/drain extension regions 116 and 118 or the source/drain contact regions 134 and 136. When the formed semiconductor device is the PMOS device, the dopant of the extra implantation regions 128 and 130 is P-type dopant, for example, B or $BF_3$. When the formed semiconductor device is the NMOS device, the dopant of the extra implantation regions 128 and 130 is N-type dopant, for example, P or As. The forming method of the extra implantation regions 128 and 130 includes performing an ion implantation process 132. The energy of the ion implantation process 132 is not greater than that of the source/drain contact regions and not less than that of the source/drain extension regions. The concentration of the dopant implanted in the extra implantation regions 128 and 130 is not less than that of the source/drain extension regions 116 and 118, and is not greater than that of the subsequently formed source/drain contact regions 134 and 136. The disposable spacer 110b has an enough width to retard the dopant in the extra implantation regions 128 and 130 from diffusing into the channel region. On the other hand, the extra implantation regions 128 and 130 may extend in the direction of the gate structure 101 to a part of the source/drain extension regions 116 and 118, thereby reducing the current leakage problem resulting from the substrate 100 and the buffer layers 110, 112 interface deficiencies.

Figure 1E:
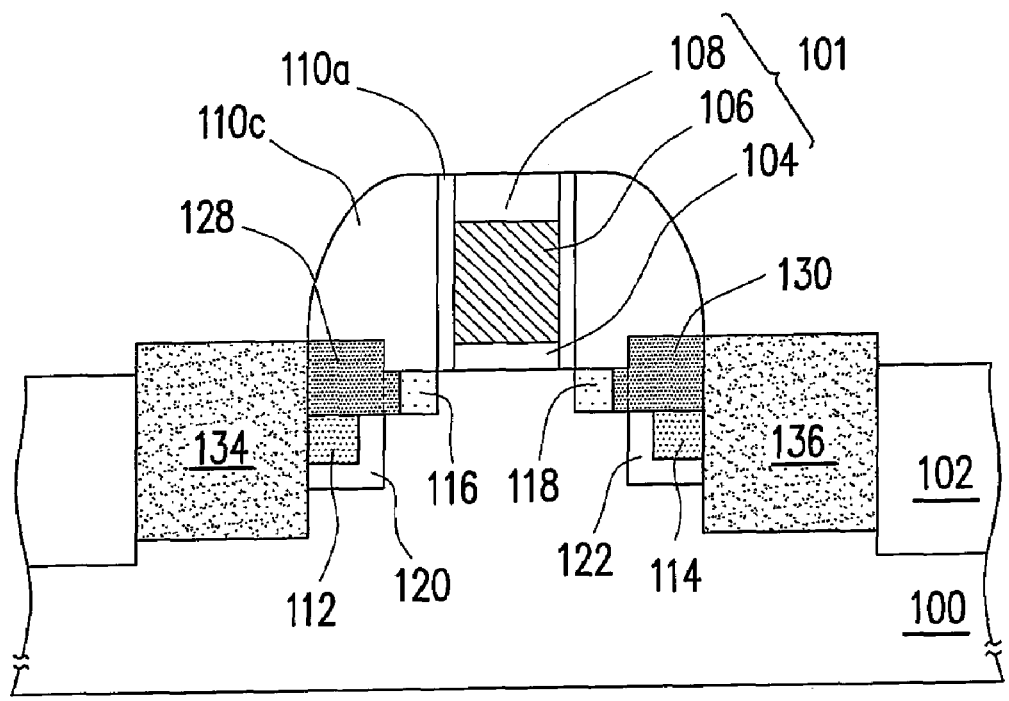

Thereafter, referring to FIG. 1E, the disposable spacer 110b is selectively removed. The method of removing the disposable spacer 110b of the gate may be the wet etching process. Then, another spacer 110c is formed. The spacer 110c may be formed by using the CVD for forming the spacer material layer and the anisotropic etching process. The material of the spacer material layer includes dielectric material, for example, silicon oxide or silicon nitride. Afterward, the ion implantation process is performed to form the source/drain contact regions 134 and 136 in the substrate 100. The concentration of the dopant of the source/drain contact regions 134 and 136 is greater than that of the extra implantation regions 128 and 130. When the formed semiconductor device is the PMOS device, the dopant of the source/drain contact regions 134 and 136 is P-type dopant, for example B. When the formed semiconductor device is the NMOS device, the dopant of the source/drain contact regions 134 and 136 is N-type dopant, for example, P or As.

Figure 1F:
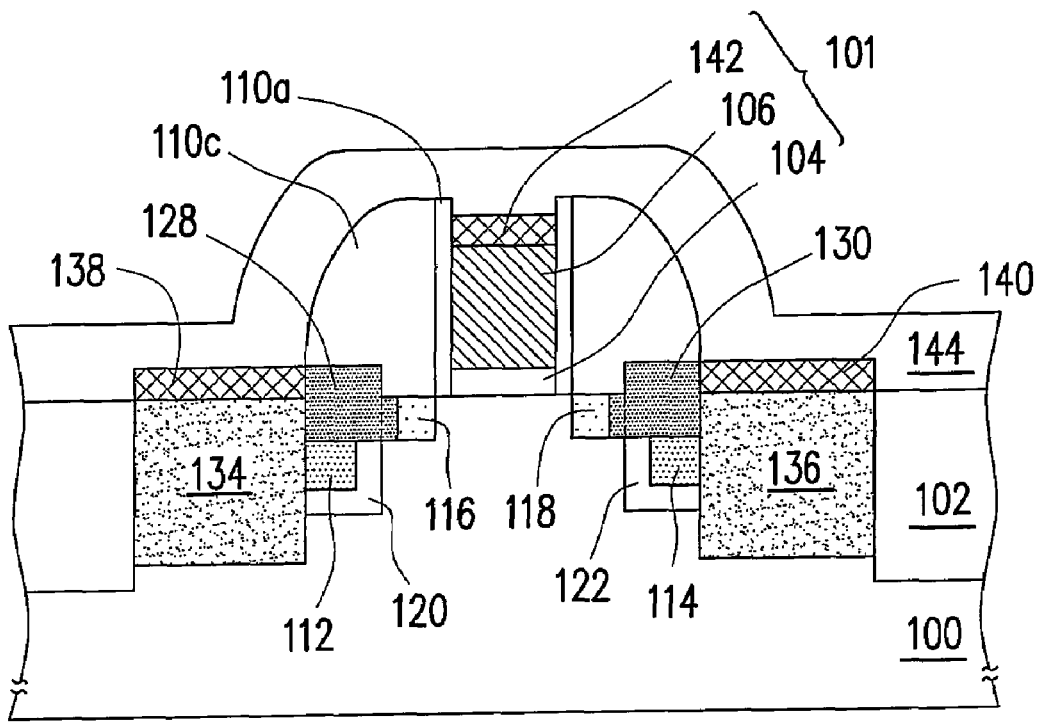

After that, referring to FIG. 1F, the cap layer 108 is selectively removed, so as to expose the gate conductive layer 106. The method of removing the cap layer 108 may be the wet etching process, for example, using a diluted hydrofluoric acid solution or phosphoric acid. Then, metal silicide layers 138, 140, and 142 are respectively formed on the source/drain contact regions 134 and 136 and the gate conductive layer 106 to reduce the resistance. The forming method of the metal silicide layers 138, 140, and 142 may adopt a self-aligned silicidation process. The metal used in the metal silicide layer includes a refractory metal, for example, Ni, Co, Ti, Cu, Mo, Ta, W, Er, Zr, Pt, and an alloy thereof. Then, a CESL 144 is formed above the substrate 100. The CESL 144 is used as the etch stop layer during the subsequent process of etching the dielectric layer, and also can provide strain required by the formed semiconductor device. The material of the CESL 144 is, for example, silicon nitride, and the forming method may adopt the CVD. Before the silicon nitride layer is formed, a silicon oxide underlayer may be formed firstly.

FIGS. 2A to 2E are schematic cross-sectional views showing processes of a method of fabricating a semiconductor device according to an embodiment of the present invention.

Figure 2A:
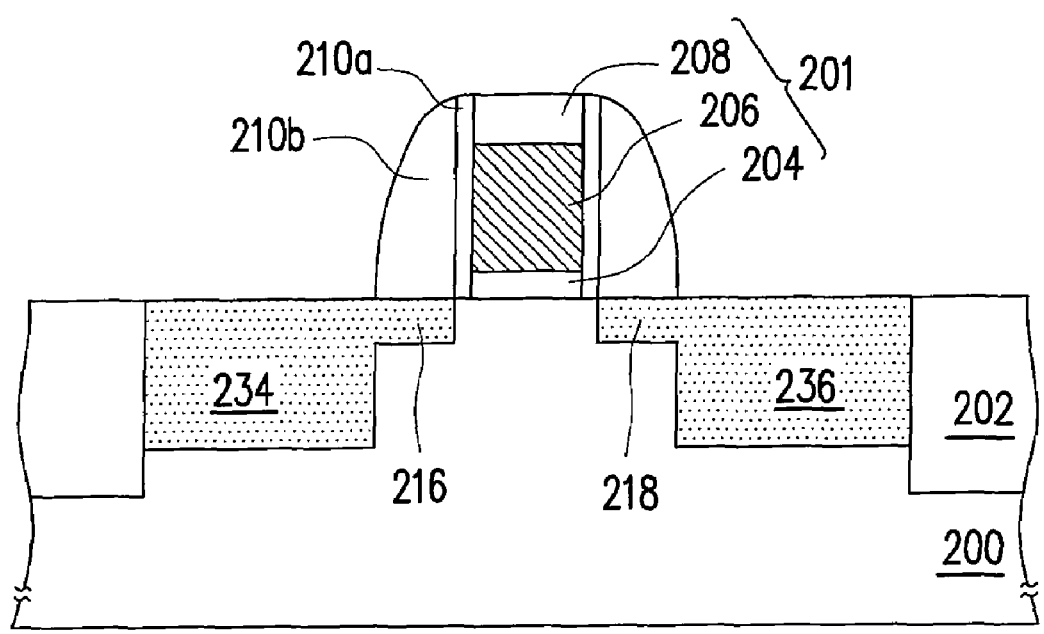
FIGS. 2A to 2E are schematic cross-sectional views showing processes of another method of fabricating a semiconductor device according to another embodiment of the present invention.

Referring to FIG. 2A, a substrate 200 is provided. The material of the substrate 200 is, for example, semiconductor, e.g. silicon, or semiconductor compound, or a silicon-on-insulator substrate. In an embodiment, the substrate 200 is an N-type doped silicon or a P-type doped silicon with the N-type well region. In another embodiment, the substrate 200 is a P-type doped silicon or an N-type doped silicon with a P-type well region. Next, an isolation structure 202 is formed in the substrate 200. The forming method of the isolation structure 202 is, for example, a shallow trench isolation structure method or a local oxidation method.

Then, a gate structure 201 is formed on the substrate 200. When the device is a MOS device, the gate structure 201 includes a patterned gate dielectric layer 204 and a patterned gate conductive layer 206. Further, the gate structure 201 may further include a pattern cap layer 208. The material of the gate dielectric layer 204 is, for example, silicon oxide, silicon nitride, silicon oxynitride, or a high-k material, and the forming method is, for example, thermal oxidation or chemical vapor deposition (CVD). When the material of the gate conductive layer 206 is doped silicon or doped polysilicon, the dopant in the silicon or the polysilicon may be N-type dopant, and may also be P-type dopant. The material of the cap layer 208 is, for example, silicon oxide, and the forming method is, for example, CVD. Then, an offset spacer 210a is formed at the sidewall of the gate structure 201. The material of the offset spacer 210a is, for example, silicon oxide or silicon nitride, and the forming method is, for example, thermal oxidation or CVD.

Then, source/drain extension regions 216 and 218 and a pocket-doped region (not shown) are formed in the substrate 200 at two sides of the gate structure 201. When the formed semiconductor device is the PMOS device, the dopant of the source drain extension regions 216 and 218 is P-type dopant, for example, B, and the dopant of the pocket-doped region is N-type dopant, for example, P or As. When the formed semiconductor device is an NMOS device, the dopant of the source drain extension regions 216 and 218 is N-type dopant, for example, P or As, and the dopant of the pocket-doped region is P-type dopant, for example, B. The forming method of the source/drain extension regions 216 and 218 includes performing an ion implantation process. The pocket-doped region may be formed through an ion implantation process.

After that, a spacer 210b is formed on the offset spacer 210a of the sidewall of the gate structure 201. The spacer 210b may be formed by using the CVD for forming the spacer material layer and the anisotropic etching process. The material of the spacer material layer includes a dielectric material, for example, silicon oxide or silicon nitride.

Then, source/drain contact regions 234 and 236 are formed in the substrate 200. The forming method of the source/drain contact regions 234 and 236 may adopt an ion implantation process. When the formed semiconductor device is the PMOS device, the dopant of the source/drain contact regions 234 and 236 is P-type dopant, for example, B. When the formed semiconductor device is the NMOS device, the dopant of the source/drain contact regions 234 and 236 is N-type dopant, for example, P or As.

Figure 2B:
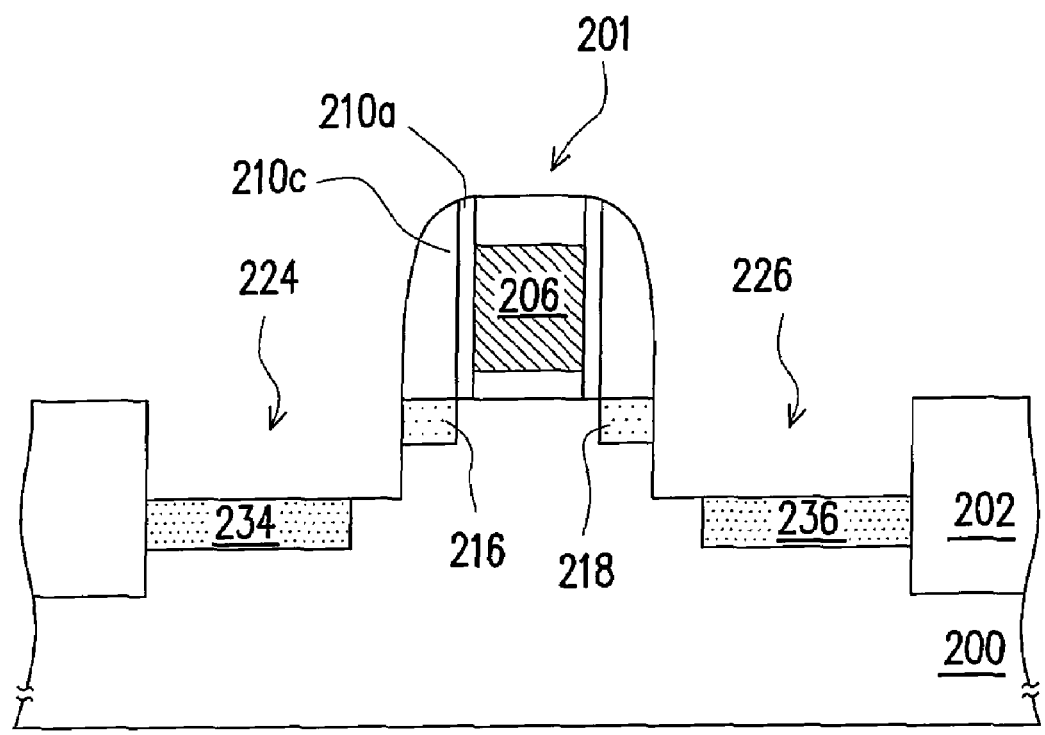

Then, referring to FIG. 2B, the spacer 210b is removed, and then a disposable spacer 210c with a narrow width is formed. The method of removing the spacer 210b may be the wet etching process. The disposable spacer 210c may be formed by using the CVD for forming the spacer material layer and the anisotropic etching process. The material of the spacer material layer includes a dielectric material, for example, silicon oxide or silicon nitride.

Then, the cap layer 208 and the disposable spacer 210c are used as a mask to perform an etching process to etch the substrate 200 at two sides of the gate structure 201, so as to form recesses 224 and 226 above the left source/drain contact regions 234 and 236. The etching process includes an anisotropic etching process or an isotropic etching process. The anisotropic etching process includes a dry etching process. In an embodiment, the dry etching process is, for example, a plasma etching process, and the introduced reaction gases are fluoro-hydrocarbons, for example, $CF_4$ and $CHF_3$. The isotropic etching process is, for example, the dry etching process or the wet etching process. In an embodiment, the dry etching process is the plasma etching process, and the introduced reaction gases are $NF_3$, $O_2$, and $Cl_2$. The method of the wet etching process, for example, uses the KOH solution as the etchant.

Figure 2C:
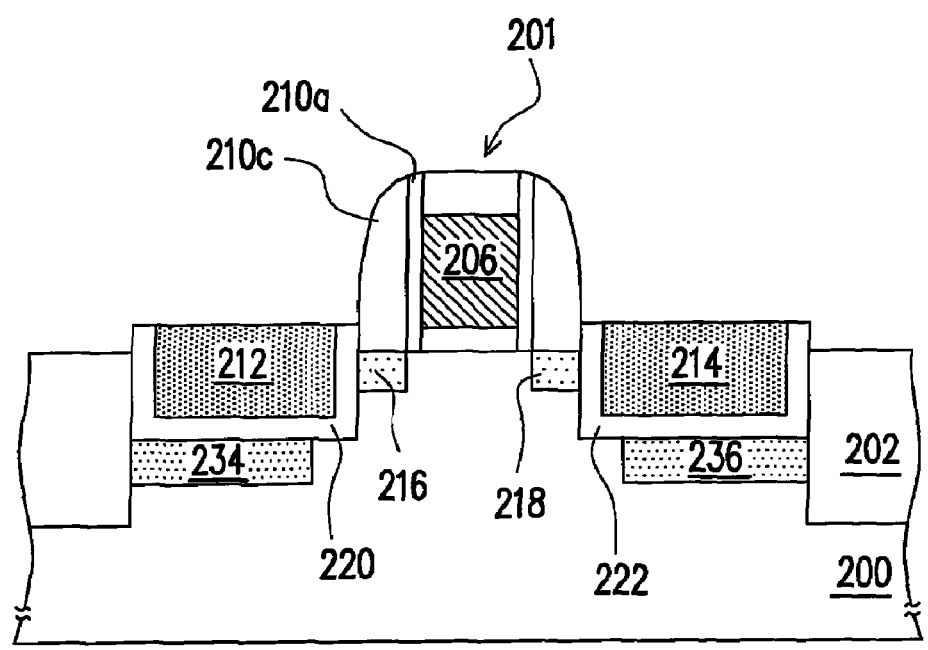

After that, referring to FIG. 2C, firstly buffer layers 220 and 222 are formed in the recesses 224 and 226, and then the doped semiconductor compound layers 212 and 214 are formed. The buffer layers 220 and 222 and the doped semiconductor compound layers 212 and 214 may be located only in the recesses 224 and 226, or extend upwards from the bottom of the recess and protrude out of the surface of the substrate 200. The material of the buffer layers 220 and 222 and the doped semiconductor compound layers 212 and 214 is different from the material of the substrate 200, and includes the undoped semiconductor compound material or the lightly doped semiconductor compound material having the same conductivity type of the source/drain extension regions 216 and 218, the semiconductor compound layers 212 and 214, or the subsequently formed source/drain contact regions.

When the formed semiconductor device is the PMOS device, the semiconductor compound material for forming the buffer layers 220 and 222 includes non-doped SiGe or SiGe with low P-type dopant, for example, B. The forming method of the buffer layers 220 and 222 may adopt the CVD to perform a selective area epitaxy growth process of silicon to form an undoped SiGe epitaxy layer. The reaction gases adopted for forming the undoped SiGe epitaxy layer include the Si and the Ge sources. For example, silane or halogenosilane are used as the Si source, and germane is used as the Ge source. Silane is, for example, silicon tetrahydride, and halogenosilane is, for example, dichlorosilane. In an embodiment, the adopted reaction gases include dichlorosilane, germane, and hydrogen chloride. In another embodiment, the material of the buffer layers 220 and 222 is SiGe with low B. B may be doped in-situ with borane introduced during the SiGe epitaxy forming process, or may result from the diffusion of B in the source drain extension regions 216 and 218 or the subsequently formed doped regions 212 and 214.

When the formed semiconductor device is a PMOS device, the material for forming the doped semiconductor compound layers 212 and 214 includes SiGe with P-type dopant, such as B. The forming method may adopt the CVD to perform the selective area epitaxy growth process of silicon and the in-situ doping to form a doped SiGe epitaxy layer after the buffer layers 220 and 222 are formed. The reaction gases adopted for forming the doped SiGe epitaxy layer include Si source, Ge source, and B-doping source. For example, silane or halogenosilane are used as the Si source, germane is used as the Ge source, and borane is used as the B-doping source. Silane is, for example, silicon tetrahydride, and halogenosilane is, for example, dichlorosilane. In an embodiment, the adopted reaction gases include dichlorosilane, germane, borane, and hydrogen chloride.

When the formed semiconductor device is an NMOS device, the semiconductor compound material for forming the buffer layers 220 and 222 includes non-doped SiC or SiC with low N-type dopant, for example, P or As. In an embodiment, the forming method of the buffer layers 220 and 222 may adopt the CVD to perform the selective area epitaxy growth process of silicon to form an undoped SiC epitaxy layer. The reaction gases adopted for forming the undoped SiC epitaxy layer include Si source and C source. The Si source includes silane or halogenosilane, and the C source includes ethylene, propane or monomethylsilane. In an embodiment, the adopted reaction gases include monomethylsilane, $Si_3H_8$, or hydrogen. In another embodiment, the material of the buffer layers 220 and 222 is SiC with low N-type dopant. The N-type dopant may be doped in-situ with $AsH_3$ or $PH_3$ introduced as the N-type doping source during the SiC epitaxy forming process.

When the formed semiconductor device is an NMOS device, the material for forming the doped semiconductor compound layers 212 and 214 includes SiC with N-type dopant, such as P or As. The forming method may also adopt the CVD to perform the selective area epitaxy growth process of silicon and the in-situ doping to form a doped SiC epitaxy layer after the buffer layers 220 and 222 are formed. The reaction gases adopted for forming the doped SiC epitaxy layer include Si source, C source, and P or As doping source. The Si source includes silane or halogenosilane, the C source includes ethylene, propane or monomethylsilane, and the P or As doping source includes $AsH_3$ or $PH_3$. In an embodiment, the adopted reaction gases include monomethylsilane, $Si_3H_8$, hydrogen, and $PH_3$.

Figure 2D:
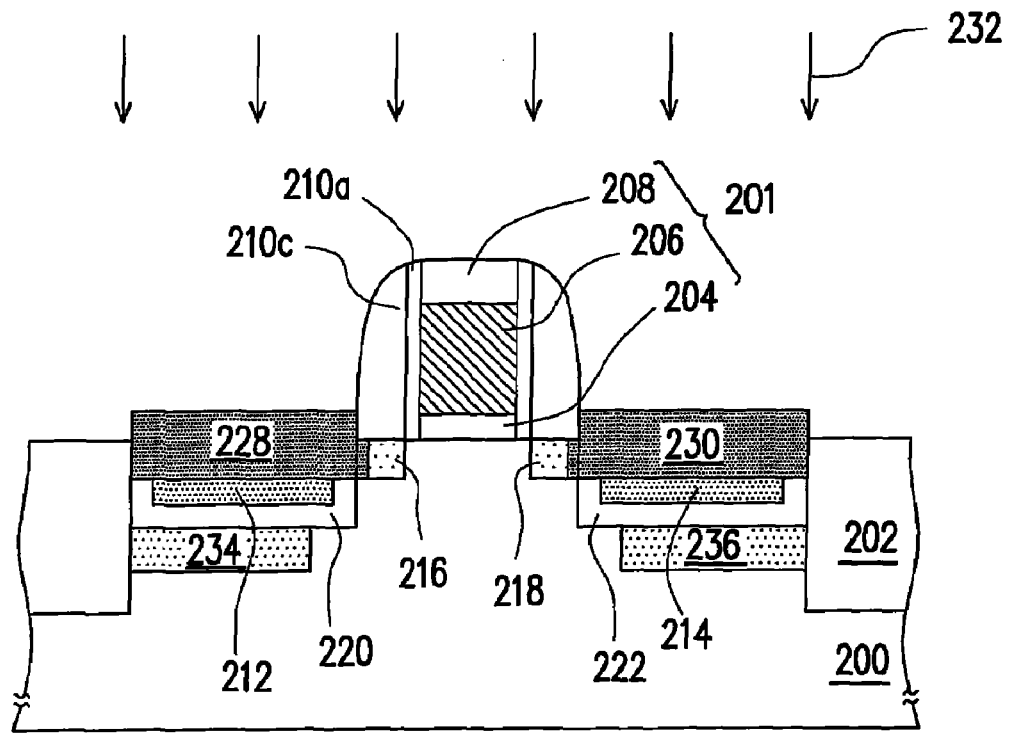

Then, referring to FIG. 2D, the dopant is implanted on the surfaces of the buffer layers 220 and 222 and doped semiconductor compound layers 212 and 214, so as to form extra implantation regions 228 and 230 with a shallow junction respectively. The dopant implanted into the extra implantation regions 228 and 230 has the same conductivity type of the source/drain extension regions 216 and 218 or the source/drain contact regions 234 and 236. When the formed semiconductor device is the PMOS device, the dopant of the extra implantation regions 228 and 230 is P-type dopant, for example, B. When the formed semiconductor device is the NMOS device, the dopant of the extra implantation regions 228 and 230 is N-type dopant, for example, P or As. The forming method of the extra implantation regions 228 and 230 includes performing an ion implantation process 232. The energy of the ion implantation process 232 is not greater than that of the source/drain contact regions and not less than that of the source/drain extension regions. The concentration of the dopant implanted into the extra implantation regions 228 and 230 is not less than that of the source/drain extension regions 216 and 218, and is not greater than that of the formed source/drain contact regions 234 and 236. The disposable spacer 210c has an enough width to retard the dopant in the extra implantation regions 228 and 230 from diffusing into the channel region. On the other hand, the extra implantation regions 228 and 230 may extend in the direction of the gate structure 201 to a part of the source/drain extension regions 216 and 218, thereby reducing the current leakage problem resulting from the substrate 200 and the buffer layers 210 and 222 interface deficiencies.

Figure 2E:
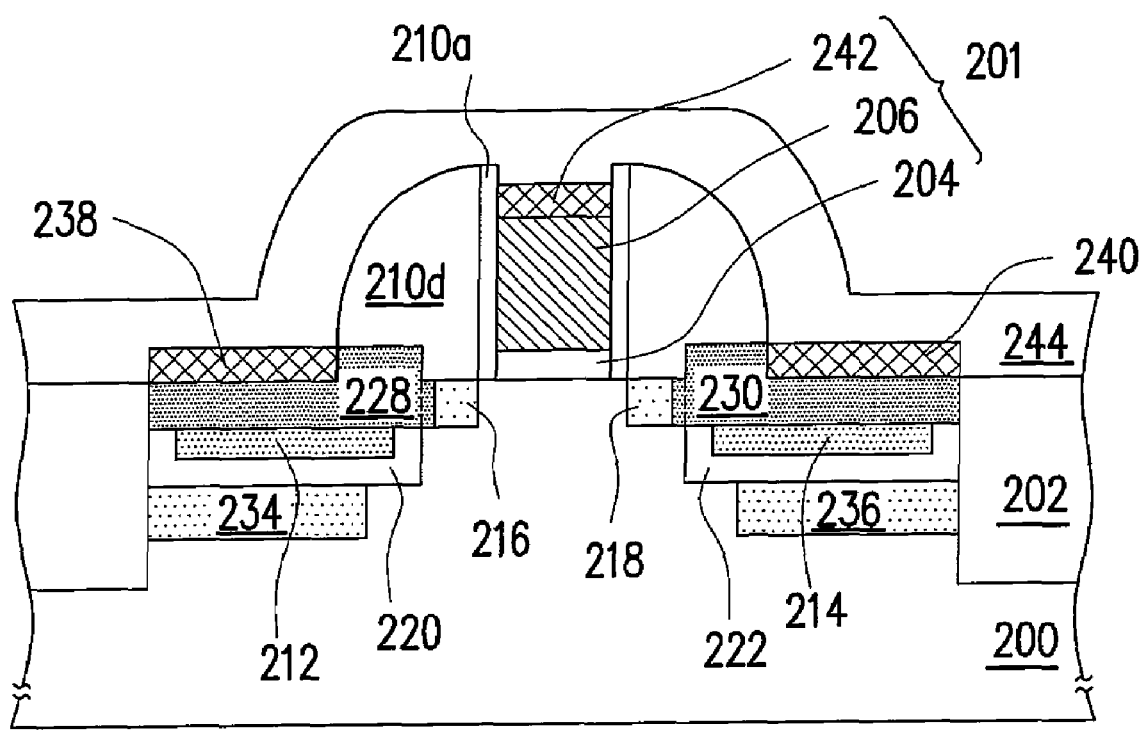

After that, referring to FIG. 2E, the disposable spacer 210c is selectively removed. The method of removing the disposable spacer 210c may be the wet etching process. Then, another spacer 210d is formed. The spacer 210d may be formed by using the CVD for forming the spacer material layer and the anisotropic etching process. The material of the spacer material layer includes a dielectric material, for example, silicon oxide or silicon nitride. The cap layer 208 is selectively removed, so as to expose the gate conductive layer 206. The method of removing the cap layer 208 may be the wet etching process, for example, using the diluted hydrofluoric acid solution. Thereafter, metal silicide layers 238, 240, and 242 are respectively formed on the source/drain contact regions 234 and 236 and the gate conductive layer 206 to reduce the resistance. The forming method of the metal silicide layers 238, 240, and 242 may adopt the self-aligned silicidation process. The metal used in the metal silicide layer includes a refractory metal, for example, Ni, Co, Ti, Cu, Mo, Ta, W, Er, Zr, Pt, and an alloy thereof. Then, a CESL 244 is formed above the substrate 200. The CESL 244 is used as the etch stop layer during the subsequent process of etching the dielectric layer, and may also provide the strain required by the formed semiconductor device. The material of the CESL 244 is, for example, silicon nitride, and the forming method may adopt the CVD. Before the silicon nitride layer is formed, a silicon oxide underlayer is formed firstly.

In the method of fabricating the semiconductor device according to the embodiments of the present invention, the extra implantation regions are formed on the surface of the buffer layer, so as to solve the problem of the over-high resistance resulting from the forming of the buffer layer.

In the method of fabricating the semiconductor device according to the embodiments of the present invention, a simple ion implantation process is adopted to form the extra implantation regions on the surface of the buffer layer.

In the method of fabricating the semiconductor device according to the embodiments of the present invention, the dopant with the same conductivity type of the source/drain region is implanted into the formed extra implantation region, which will not relax the strain of the formed doped semiconductor compound layer.

In the method of fabricating the semiconductor device according to the embodiments of the present invention, the extra implantation regions may extend from the surface of the buffer layer into the source/drain extension region, thereby reducing the current leakage problem resulting from the substrate and the buffer layer interface deficiencies.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a semiconductor device, comprising:
   forming a gate structure on a substrate;
   forming a source/drain extension region respectively in the substrate at two sides of the gate structure followed by forming a first spacer at a sidewall of the gate structure and forming a recess respectively in the substrate at two sides of the first spacer;
   forming a buffer layer and a doped semiconductor compound layer in each recess;
   forming an extra implantation region respectively on the exposed surfaces of the buffers layer and the doped semiconductor compound layers, wherein a depth in the substrate of the extra implantation region is less than a depth in the substrate of the corresponding doped semiconductor compound layer; and
   forming a source/drain contact region respectively in the substrate at two sides of the gate structure, wherein the extra implantation regions and the source/drain contact regions have dopants of the same conductivity type.

2. The method of fabricating a semiconductor device as claimed in claim 1, wherein the source/drain contact regions are formed after the extra implantation regions are formed, and a forming method of the source/drain contact regions comprises:
   forming a second spacer at the sidewall of the gate structure; and
   performing an ion implantation process, so as to form the source/drain contact regions in the substrate not covered by the second spacer.

3. The method of fabricating a semiconductor device as claimed in claim 2, further comprising removing the first spacer before forming the second spacer.

4. The method of fabricating a semiconductor device as claimed in claim 1, further comprising forming an offset spacer at the sidewall of the gate structure before forming the source/drain extension regions.

5. The method of fabricating a semiconductor device as claimed in claim 1, wherein the source/drain contact regions are formed after the gate structure is formed and before the first spacer is formed, and the method comprises:
   forming a second spacer at the sidewall of the gate structure;
   performing an ion implantation process, so as to form the source/drain contact regions in the substrate; and
   removing the second spacer.

6. The method of fabricating a semiconductor device as claimed in claim 5, further comprising forming a source/drain extension region respectively in the substrate at two sides of the gate structure before forming the second spacer.

7. The method of fabricating a semiconductor device as claimed in claim 6, further comprising forming an offset spacer at the sidewall of the gate structure before forming the source/drain extension regions.

8. The method of fabricating a semiconductor device as claimed in claim 1, wherein a forming method of the extra implantation regions comprises performing an ion implantation process.

9. The method of fabricating a semiconductor device as claimed in claim 8, wherein an energy of the ion implantation process is not greater than that of the source/drain contact regions and not less than that of the source/drain extension regions.

10. The method of fabricating a semiconductor device as claimed in claim 1, wherein a concentration of dopant implanted in the extra implantation regions is not greater than that of the source/drain contact regions.

11. The method of fabricating a semiconductor device as claimed in claim 1, wherein a concentration of dopant implanted in the extra implantation regions is not less than that of the two source/drain extension regions formed in the substrate.

12. The method of fabricating a semiconductor device as claimed in claim 1, wherein the semiconductor device comprises a PMOS device.

13. The method of fabricating a semiconductor device as claimed in claim 12, wherein the doped semiconductor compound comprises P-type doped SiGe.

14. The method of fabricating a semiconductor device as claimed in claim 12, wherein the buffer layer comprises an undoped SiGe or a P-type doped SiGe with a dopant concentration lower than that of the doped semiconductor compound.

15. The method of fabricating a semiconductor device as claimed in claim 1, wherein the semiconductor device comprises an NMOS device.

16. The method of fabricating a semiconductor device as claimed in claim 15, wherein the doped semiconductor compound comprises N-type doped SiC.

17. The method of fabricating a semiconductor device as claimed in claim 15, wherein the buffer layer comprises an undoped SiC or an N-type doped SiC with a dopant concentration lower than that of the doped semiconductor compound.

18. The method of fabricating a semiconductor device as claimed in claim 1, further comprising forming a contact etch stop layer (CESL) above the substrate.

* * * * *